(12) United States Patent
Hsu

(10) Patent No.: US 7,224,062 B2
(45) Date of Patent: May 29, 2007

(54) CHIP PACKAGE WITH EMBEDDED PANEL-SHAPED COMPONENT

(75) Inventor: Chi-Hsing Hsu, Taipei Hsien (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 11/148,813

(22) Filed: Jun. 8, 2005

(65) Prior Publication Data

US 2006/0163723 A1 Jul. 27, 2006

(30) Foreign Application Priority Data

Jan. 21, 2005 (TW) ............................. 94101768 A

(51) Int. Cl.
*H01L 23/52* (2006.01)
*H01L 23/48* (2006.01)

(52) U.S. Cl. ............................. 257/737; 257/E25.013; 257/E23.055; 257/E23.004; 257/E23.114; 257/E23.063; 257/E23.172; 257/E23.278; 257/E23.154; 257/E23.135; 257/784; 257/734; 257/692; 257/738; 257/528; 257/686; 257/723; 257/728; 257/777; 257/778; 257/668; 257/532; 257/535

(58) Field of Classification Search ........ 257/E23.114, 257/E25.013, E23.055, E23.004, E23.063, 257/E23.172, E23.178, E23.154, E23.135, 257/686, 685, 723, 777, 525, 528, 737, 738
See application file for complete search history.

(56) References Cited

U.S. PATENT DOCUMENTS

| | | | | |
|---|---|---|---|---|
| 6,154,366 A * | 11/2000 | Ma et al. | ..................... | 361/704 |
| 6,373,125 B1 * | 4/2002 | Pannaccione et al. | ....... | 257/666 |
| 6,489,669 B2 * | 12/2002 | Shimada et al. | ............ | 257/686 |
| 6,890,798 B2 * | 5/2005 | McMahon | ................... | 438/122 |
| 7,078,788 B2 * | 7/2006 | Vu et al. | ..................... | 257/668 |
| 2002/0096781 A1 * | 7/2002 | Toyosawa | ................... | 257/777 |
| 2003/0137263 A1 * | 7/2003 | Peterson | ..................... | 318/445 |
| 2003/0146508 A1 * | 8/2003 | Chen et al. | .................. | 257/738 |
| 2003/0205826 A1 * | 11/2003 | Lin et al. | ..................... | 257/777 |
| 2004/0094830 A1 * | 5/2004 | Vu et al. | ..................... | 257/678 |
| 2005/0062173 A1 * | 3/2005 | Vu et al. | ..................... | 257/787 |
| 2005/0112798 A1 * | 5/2005 | Bjorbell | ...................... | 438/106 |
| 2005/0263874 A1 * | 12/2005 | Shimizu et al. | ............. | 257/700 |
| 2006/0043568 A1 * | 3/2006 | Abe et al. | .................... | 257/698 |
| 2006/0105500 A1 * | 5/2006 | Chang | ......................... | 438/121 |
| 2006/0115931 A1 * | 6/2006 | Hsu | ............................. | 438/121 |
| 2006/0157847 A1 * | 7/2006 | Hsu | ............................. | 257/737 |

* cited by examiner

*Primary Examiner*—Alexander Oscar Williams
(74) *Attorney, Agent, or Firm*—J.C. Patents

(57) ABSTRACT

A bump-less chip package is provided. The bump-less chip package includes a chip, an interconnection structure and a panel-shaped component. The panel-shaped component has a plurality of electrical terminals on a first surface thereof. The back surface of the chip is disposed on the first surface of the panel-shaped component, and the chip has a plurality of first pads on the active surface thereof away from the panel-shaped component. The interconnection structure is disposed on the first surface of the panel-shaped component and the active surface of the chip. The first pads of the chip may electrically connect with the electrical terminals of the panel-shaped component through the interconnection structure. Furthermore, the interconnection structure has a plurality of second pads on the surface away from the chip.

20 Claims, 4 Drawing Sheets

CHIP PACKAGE WITH EMBEDDED PANEL-SHAPED COMPONENT

CROSS-REFERENCE TO RELATED APPLICATION

This application claims the priority benefit of Taiwan application serial no. 94101768, filed on Jan. 21, 2005. All disclosure of the Taiwan application is incorporated herein by reference.

BACKGROUND OF THE INVENTION

1. Field of the Invention

The present invention relates to a chip package. More particularly, the present invention relates to a bump-less build-up layer (BBUL) type of chip package.

2. Description of the Related Art

With the rapid development of new electronic technologies, the electronic devices have developed to have higher processing speed, multi-function, high integration, miniaturized size and low cost. As a result, chip packaging is also developing towards miniaturization and densification. The conventional ball grid array (BGA) packaging technique often utilizes a package substrate to serve as a carrier for an integrated circuit (IC) chip and then applies flip-chip bonding or a wire bonding method to electrically connect the the chip to the top surface of the package substrate. Then, a plurality of solder balls are disposed on a bottom surface of the package substrate to form an area array. Thus, the chip can electrically connect with an electronic component in the next level, such as a printed circuit board, through an electrical circuit inside the package substrate and the solder balls at the bottom surface of the package substrate.

However, since the conventional BGA packaging technique requires a high layout density package substrate, together with a flip-chip bonding or wire bonding electrical connection, signal transmission pathway becomes too long. In solution, a new type of chip packaging technique, called the bump-less build-up layer (BBUL) method, has been developed. In the BBUL method, flip-chip bonding or wire bonding is omitted. Instead, a multi-layered interconnection structure is directly fabricated on the chip and then a plurality of electrical contacts, such as solder balls or pins, are disposed on the multi-layered interconnection structure to form an area array for electrically connecting with an electrical component in the next level.

FIG. 1 is a schematic cross-sectional view of a conventional bump-less build-up layer (BBUL) chip package. As shown in FIG. 1, the bump-less build-up layer chip package 100 mainly comprises a stiffener 110, a chip 120, an interconnection structure 130, an encapsulating layer 140 and a plurality of solder balls 150. The stiffener 110 has an opening 110a and the chip 120 is disposed inside the opening 110a. The encapsulating layer 140 is disposed between the chip 120 and the inner surfaces of the opening 110a. The chip 120 has a plurality of bonding pads 122 on its active surface. The interconnection structure 130 is disposed on the active surface of the chip 120 and is electrically connected to the bonding pads 122.

The interconnection structure 130 further comprises a plurality of dielectric layers 132, a plurality of circuit layers 134 and a plurality of conductive vias 134a. The circuit layers 134 are sequentially stacked over the chip 120 and the stiffener 110, and one of the circuit layers 134 closest to the chip 120 is electrically connected to the pads 122 on the chip 120 through the conductive vias 134a. In addition, each dielectric layer 132 is disposed between two neighboring circuit layers 134 and each conductive via 134a passes through one of the dielectric layers 132 for electrically connecting at least two circuit layers 134. Furthermore, the conventional BBUL package chip 100 includes a plurality of bonding pads 160 and a solder mask layer 170. The bonding pads 160 are disposed on the interconnection structure 130, and the solder mask layer 170 is disposed on the interconnection structure 130 to expose the bonding pads 160. The solder balls 150 are disposed over the bonding pads 160, respectively.

Although the conventional bump-less build-up layer chip package 100 has good reliability and high electrical performance, the problem of cross talk at high frequency transmission is increasingly serious due to increased circuit layout density and reduced line pitch. In other words, the quality of the BBUL package chip 100 will deteriorate as the circuit layout density is increased and the line pitch is reduced.

SUMMARY OF THE INVENTION

Accordingly, at least one objective of the present invention is to provide a bump-less chip package having better electrical performance and higher heat-dissipating capacity.

To achieve these and other advantages and in accordance with the purpose of the invention, as embodied and broadly described herein, the invention provides a bump-less chip package, comprising a panel-shaped component, a chip and an interconnection structure. The panel-shaped component has a plurality of electrical terminals on a first surface thereof. The back surface of the chip is disposed on the first surface of the panel-shaped component and the chip has a plurality of first pads on the active surface away from the panel-shaped component. The interconnection structure is disposed on the first surface of the panel-shaped component and the active surface of the chip. The first pads of the chip may electrically connect with the electrical terminals of the panel-shaped component through the interconnection structure. Furthermore, the interconnection structure has a plurality of second pads on the surface away from the chip.

According to the present invention, the chip is disposed on the panel-shaped component, which has great heat-dissipating capacity. Thus, heat generated by the chip can be rapidly transmitted to the panel-shaped component and hence the bump-less chip package has a higher heat-dissipating capacity. Furthermore, if the panel-shaped component is a capacitor or other type of passive component, the bump-less chip package can have even better electrical performance. Moreover, the panel-shaped component can be another chip so that the package becomes a stacked bump-less multi-chip package.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
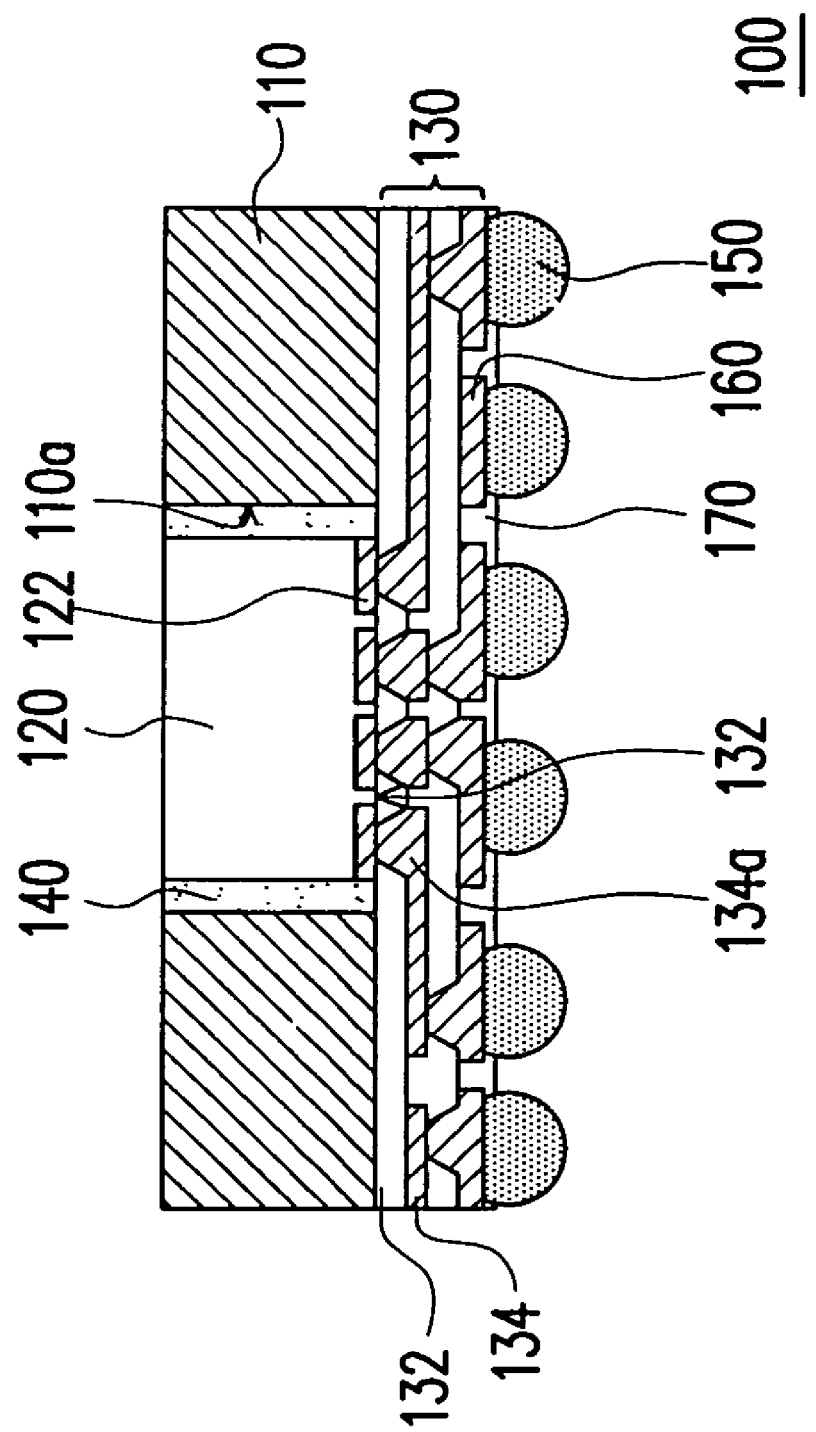
FIG. 1 is a schematic cross-sectional view of a conventional bump-less build-up layer (BBUL) chip package.

Reference will now be made in detail to the present embodiments of the invention, examples of which are illustrated in the accompanying drawings. Wherever possible, the same reference numbers are used in the drawings and the description to refer to the same or like parts.

First Embodiment

Figure 2:
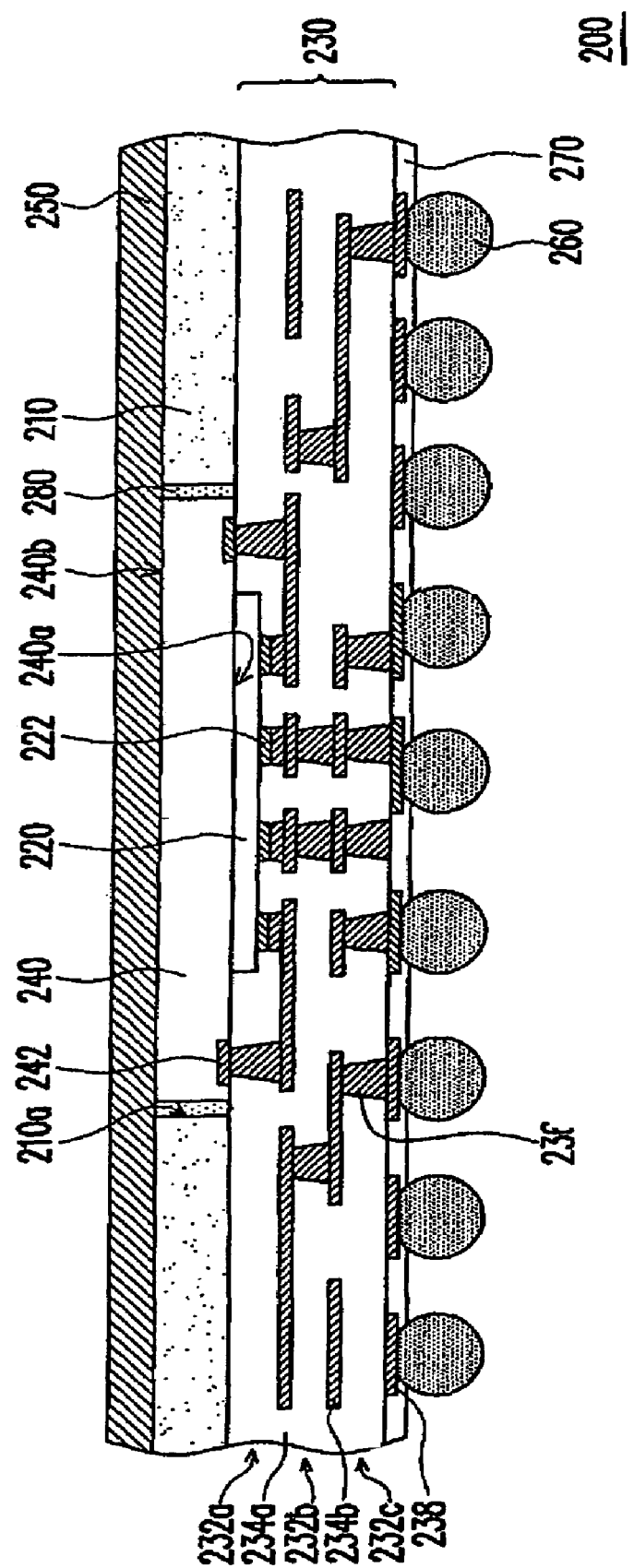
FIG. 2 is a schematic cross-sectional view of a bump-less chip package according to a first embodiment of the present invention.

FIG. 2 is a schematic cross-sectional view of a bump-less chip package according to a first embodiment of the present invention. As shown in FIG. 2, the bump-less chip package 200 in the present embodiment comprises a stiffener 210, a chip 220, an interconnection structure 230 and a panel-shaped component 240. The stiffener 210 has at least one opening 210a. The panel-shaped component 240 is embedded within the opening 210a. In addition, the panel-shaped component 240 has a plurality of electrical terminals 242, such as electrodes or conductive pads, on a first surface 240a thereof. It should be noted that for the panel-shaped component 240 to be fixed inside the opening 210a, some encapsulating material 280 is filled between the panel-shaped component 240 and the stiffener 210. The stiffener 210 is fabricated using a material such as glass or metal. However, the stiffener 210 may be fabricated using other dielectric material or conductive material.

The back surface of the chip 220 is disposed on the first surface 240a of the panel-shaped component 240. The chip 220 has a plurality of bonding pads 222 disposed on a surface thereof away from the panel-shaped component 240, such as the active surface of the chip 220. The chip 220 is attached to the panel-shaped component 240 through an adhesive layer or a soldering layer (not shown). In addition, the interconnection structure 230 is disposed on the stiffener 210, the panel-shaped component 240 and the chip 220. The chip 220 is electrically connected to the internal circuits within the interconnection structure 230. The interconnection structure 230 is a bump-less build-up layer (BBUL), for example. In other words, the stiffener 210 and the chip 220 are electrically connected directly through the internal circuits inside the interconnection structure 230 instead of bumps in the conventional flip-chip package.

The interconnection structure 230 further comprises a plurality of dielectric layers 232a, 232b, 232c, a plurality of circuit layers 234a, 234b and a plurality of conductive vias 236. The dielectric layers 232a, 232b, 232c and the circuit layers 234a, 234b are alternately laid on the stiffener 210 and the chip 220. Each of these conductive vias 236 passes through one of the dielectric layers 232a, 232b and 232c. Furthermore, the circuit layers 234a and 234b are electrically connected through some of these conductive vias 236. The conductive vias 236, together with the circuit layers 234a and 234b, constitute the internal circuits of the interconnection structure 230. The circuit layers 234a and 234b are electrically connected to the bonding pads 222 on the chip 220 through some of these conductive vias 236.

Figure 4:
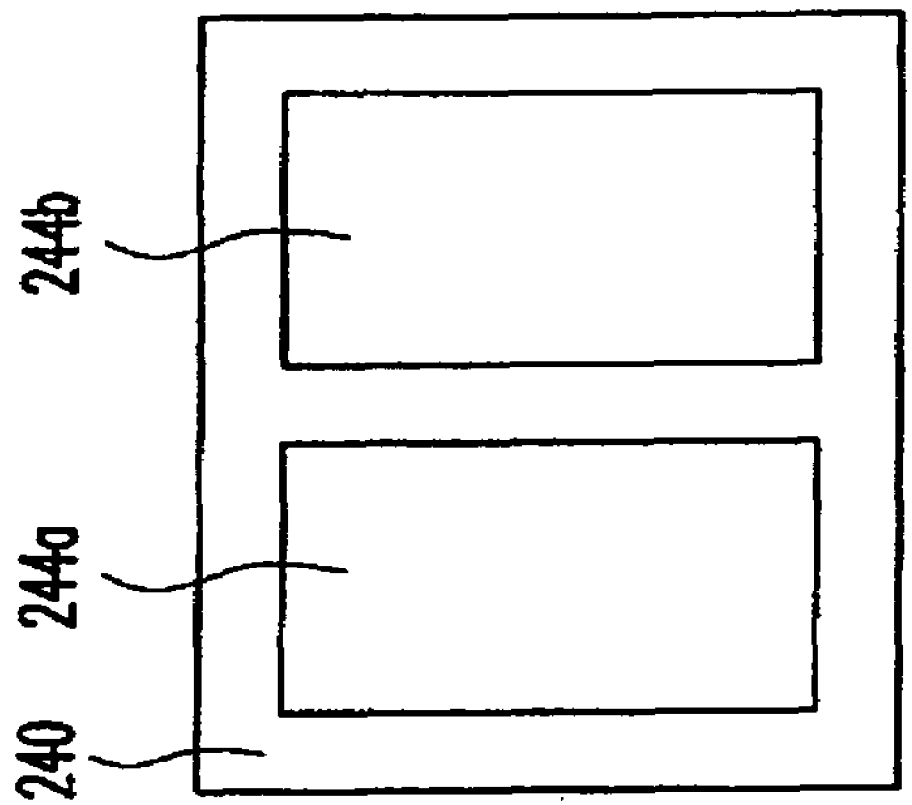
FIG. 4 is a schematic top view of the chip in FIG. 2.

Referring to FIG. 2, the panel-shaped component 240 is a panel-shaped active component or a panel-shaped passive component, for example. The panel-shaped active component is a panel-shaped transistor, and the panel-shaped passive component is a panel-shaped capacitor, a panel-shaped resistor or a panel-shaped inductor, for example. It should be noted that the panel-shaped component 240 could be an integrative panel-shaped component that includes both the active devices 244a and passive devices 244b as shown in FIG. 4. In addition, a semiconductor production process or a ceramic sintering process can be used to fabricate the panel-shaped component 240. In other words, the panel-shaped component 240 can be fabricated using silicon or ceramic material.

The panel-shaped component 240 has a plurality of electrical terminals 242 on a surface close to the chip 220. The electrical terminals 242 are electrically connected to the bonding pads 222 of the chip 220 through internal circuits inside the interconnection structure 230. Furthermore, the interconnection structure 230 also has a plurality of bonding pads 238 on a surface away from the chip 220. The bonding pads 238 are electrically connected to the chip 220 and the panel-shaped component 240 through the internal circuits inside the interconnection structure 230. In addition, the bonding pads 238 may belong to the same patterned conductive layer and have the same manufacturing process as the circuit layer 234a and 234b.

It should be noted that the bonding pads 238 could serve as a land grid array (LGA) type of signal input/output interface if no electrical contacts 260 are formed on the bonding pads 238. In addition, an electrical contact 260 may be formed on each bonding pad 238. In the present embodiment, the electrical contacts 260 are conductive balls to serve as a ball grid array (BGA) type of signal input/output interface. In an alternative embodiment of the present invention, the electrical contacts 260 can be pins to serve as a pin grid array (PGA) or land grid array (LGA) type of signal input/output interface (not shown). When the bonding pads 238 are soldered to electrical contacts 260, a solder mask layer 270 may be disposed on the interconnection structure 230 to expose the bonding pads 238 and protect the surface circuits of the interconnection structure 230.

Because the chip 220 is disposed on the first surface 240a of the panel-shaped component 240 and a second surface 240b of the panel-shaped component 240 is exposed, the heat generated by the chip 220 can be transmitted to the panel-shaped component 240. In other words, compared with the conventional technology, the bump-less chip package 200 not only has a higher heat-dissipating capacity, but also better electrical performance. Nevertheless, to further increase the heat-dissipating capacity of the bump-less chip package 200, a heat spreader 250 may be disposed on the surface of the stiffener 210 and the panel-shaped component 240 away from the interconnection structure 230 to carry the heat generated by the chip 220 to the heat spreader 250.

It should be noted that the bump-less chip package 200 has smaller voltage fluctuation when the panel-shaped component 240 is a panel-shaped capacitor and the chip 220 is disposed on panel-shaped component 240. Thus, the electrical performance of the bump-less chip package 200 can be improved. In addition, the bump-less chip package 200 in the present embodiment is not limited to a single chip module. A multi-chip module (MCM) can also be implemented in the present invention. Furthermore, the number of panel-shaped components 240 in the bump-less chip package 200 of the present invention is not limited to one, but can be more than one.

Second Embodiment

Figure 3:
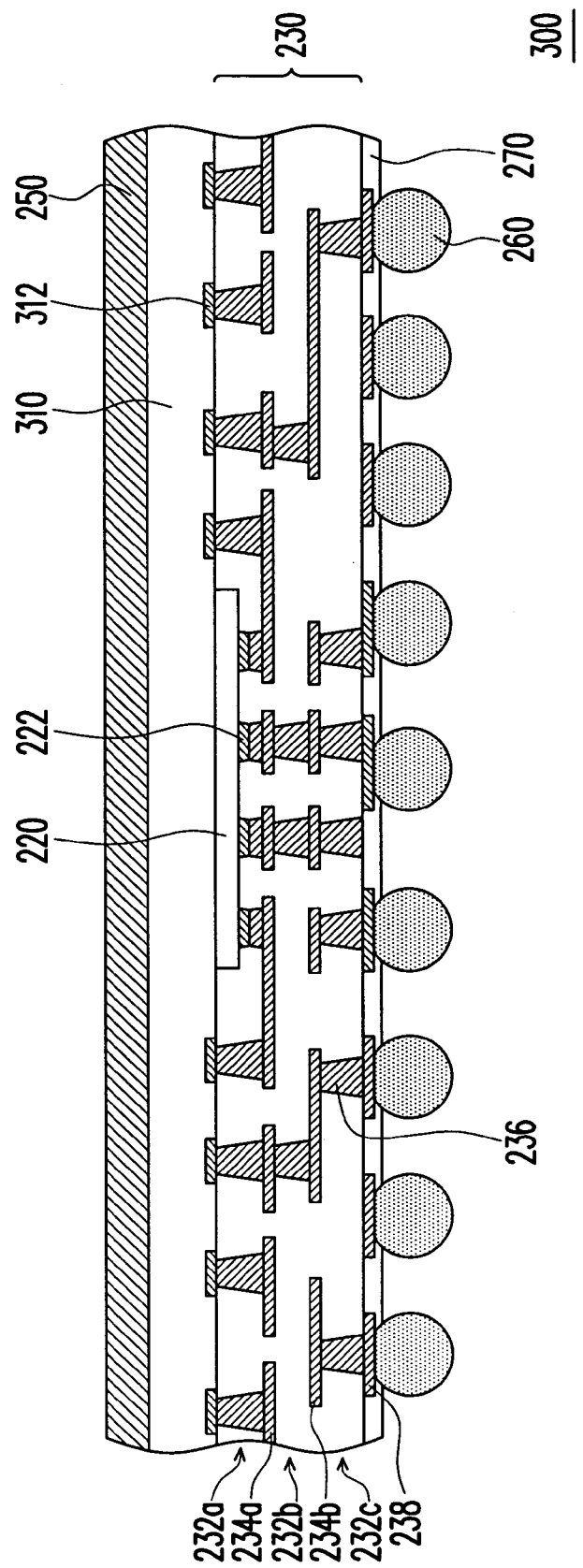
FIG. 3 is a schematic cross-sectional view of a bump-less chip package according to a second embodiment of the present invention.

FIG. 3 is a schematic cross-sectional view of a bump-less chip package according to a second embodiment of the present invention. As shown in FIG. 3, the second embodiment is very similar to the first embodiment except that the bump-less chip package 300 in the second embodiment, the size of panel-shaped component 210 is substantially identical to that of the interconnection structure 230 so that the panel-shaped component 210 can be regarded as a carrier for carrying the chip 220 and the interconnection structure 230 is disposed on the chip 220 and the panel-shaped component 310. In other words, the present embodiment does not have a similar structure to the stiffener 210 and the encapsulating material 280 in FIG. 2. Furthermore, the electrical terminals 312 of the panel-shaped component 310 can have different pattern arrangement, such as a surface array, concentric rings or other type of organization.

Similarly, the panel-shaped component 310 can be a panel-shaped active component or a panel-shaped passive component. The panel-shaped active component is a panel-shaped transistor and the panel-shaped passive component is a panel-shaped capacitor, a panel-shaped resistor or a panel-shaped inductor, for example. In addition, the panel-shaped component 310 can be an integrative panel-shaped component comprising both the panel-shaped active devices and panel-shaped passive devices.

In summary, the panel-shaped component serves as the carrier (or local carrier) of bump-less build-up layer (BBUL) type of bump-less chip package and connects electrically with the chip. When the panel-shaped component has a high coefficient of thermal conduction, the bump-less chip package of the present invention has a very high heat dissipating efficiency. When the panel-shaped component is a panel-shaped capacitor, the bump-less chip package of the present invention has smaller voltage fluctuation and cross talk. Therefore, the package has better electrical performance. Furthermore, the panel-shaped component in the bump-less chip package does not occupy any area in the bump-less chip package for external electrical connection because it is located on another surface of the bump-less chip package close to the chip. This arrangement can decrease the number of components assembled through surface mount technology, reduce overall area occupation of the components, and shorten the transmission pathway to the panel-shaped component and the chip. Ultimately, overall electrical performance of the bump-less chip package can be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package, comprising:
   a stiffener having an opening;
   at least a panel-shaped component embedded within the opening, wherein the panel-shaped component has a plurality of electrical terminals on a first surface thereof;
   at least a chip disposed on the first surface of the panel-shaped component, wherein the chip has a plurality of first bonding pads disposed on a surface thereof away from the panel-shaped component; and
   an interconnection structure disposed on the stiffener, the panel-shaped component and the chip, wherein the first bonding pads of the chip are electrically connected to the electrical terminals of the panel-shaped component through the interconnection structure and the interconnection structure has a plurality of second bonding pads disposed on a surface of the interconnection structure away from the chip.

2. The chip package of claim 1, wherein the interconnection structure further comprises:
   a plurality of dielectric layers;
   a plurality of conductive vias passing through the dielectric layers; and
   a plurality of circuit layers, wherein the circuit layers and the dielectric layers are alternately laid and one of the circuit layers is electrically connected to another of the circuit layers through one of the conductive vias.

3. The chip package of claim 1, wherein the package further comprises a plurality of electrical contacts disposed on the second bonding pads.

4. The chip package of claim 3, wherein each electrical contact is a conductive ball or a conductive pin.

5. The chip package of claim 1, wherein the package further comprises a heat spreader disposed on the stiffener and a second surface of the panel-shaped component away from the chip.

6. The chip package of claim 1, wherein the package further comprises a solder mask layer disposed on the interconnection structure to expose the second bonding pads.

7. The chip package of claim 1, wherein the panel-shaped component is a panel-shaped active component.

8. The chip package of claim 1, wherein the panel-shaped component is a panel-shaped passive component.

9. The chip package of claim 1, wherein the panel-shaped component has at least an active device and at least a passive device.

10. The chip package of claim 1, wherein the material constituting the panel-shaped component comprises silicon or ceramics.

11. A chip package, comprising:
    at least a panel-shaped component having a plurality of electrical terminals on a first surface thereof;
    at least a chip disposed on the first surface of the panel-shaped component, wherein the chip has a plurality of first bonding pads disposed on a surface thereof away from the panel-shaped component; and
    an interconnection structure disposed on the panel-shaped component and the chip, wherein the first bonding pads of the chip is electrically connected to the electrical terminals of the panel-shaped component through the interconnection structure and the interconnection structure has a plurality of second bonding pads disposed on a surface of the interconnection structure away from the chip.

12. The chip package of claim 11, wherein the interconnection structure further comprises:
    a plurality of dielectric layers;
    a plurality of conductive vias passing through the dielectric layers; and
    a plurality of circuit layers, wherein the circuit layers and the dielectric layers are alternately laid and one of the circuit layers is electrically connected to another of the circuit layers through one of the conductive vias.

13. The chip package of claim 11, wherein the package further comprises a plurality of electrical contacts disposed on the second bonding pads.

14. The chip package of claim 13, wherein each electrical contact is a conductive ball or a conductive pin.

15. The chip package of claim 11, wherein the package further comprises a heat spreader disposed on a second surface of the panel-shaped component away from the chip.

16. The chip package of claim 11, wherein the package further comprises a solder mask layer disposed on the interconnection structure to expose the second bonding pads.

17. The chip package of claim 11, wherein the panel-shaped component is a panel-shaped active component.

18. The chip package of claim 11, wherein the panel-shaped component is a panel-shaped passive component.

19. The chip package of claim 11, wherein the panel-shaped component has at least an active device and at least a passive device.

20. The chip package of claim 1, wherein the material constituting the panel-shaped component comprises silicon or ceramics.

* * * * *